United States Patent
Chen et al.

(10) Patent No.: US 11,147,191 B2
(45) Date of Patent: Oct. 12, 2021

(54) LIQUID COOLING WITH OUTDOOR CHILLER RACK SYSTEM

(71) Applicant: QUANTA COMPUTER INC., Taoyuan (TW)

(72) Inventors: Chao-Jung Chen, Taoyuan (TW); Yu-Nien Huang, Taoyuan (TW); Chih-Ming Chen, Taoyuan (TW); Tsung-Ta Li, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 123 days.

(21) Appl. No.: 16/173,529

(22) Filed: Oct. 29, 2018

(65) Prior Publication Data
US 2020/0137927 A1    Apr. 30, 2020

(51) Int. Cl.
H05K 7/20    (2006.01)

(52) U.S. Cl.
CPC ..... *H05K 7/20636* (2013.01); *H05K 7/20327* (2013.01); *H05K 7/20781* (2013.01); *H05K 7/20836* (2013.01); *H05K 7/20381* (2013.01)

(58) Field of Classification Search
CPC .......... H05K 7/20636; H05K 7/20327; H05K 7/20781; H05K 7/20836; H05K 7/20381
See application file for complete search history.

(56) References Cited

U.S. PATENT DOCUMENTS

| 6,796,372 | B2 | 9/2004 | Bear |
| 8,817,473 | B2 * | 8/2014 | Babish ............... H05K 7/20781 |
| | | | 361/699 |
| 9,089,078 | B2 * | 7/2015 | Branton ............. H05K 7/20754 |
| 2004/0221604 | A1 * | 11/2004 | Ota .................... H05K 7/20781 |
| | | | 62/259.2 |
| 2008/0259566 | A1 | 10/2008 | Fried |
| 2009/0154096 | A1 * | 6/2009 | Iyengar ............. H05K 7/20754 |
| | | | 361/694 |
| 2009/0154104 | A1 | 6/2009 | Kondo et al. |
| 2011/0247348 | A1 | 10/2011 | Mashiko et al. |
| 2012/0138285 | A1 * | 6/2012 | Tsubaki ............. H05K 7/20781 |
| | | | 165/293 |
| 2013/0077238 | A1 | 3/2013 | Babish et al. |

(Continued)

FOREIGN PATENT DOCUMENTS

EP    2152054 A2    2/2010

OTHER PUBLICATIONS

Extended European Search Report for EP Application No. 19153570.7, dated Aug. 6, 2019.

(Continued)

*Primary Examiner* — Ana M Vazquez
(74) *Attorney, Agent, or Firm* — Nixon Peabody LLP

(57) ABSTRACT

A method of maintaining a server rack within a predetermined temperature range, including the removal of heat from the server rack by both conductive and convective heat transfer. Thermal contact structure is placed between the server rack and a heat sink. The heat sink may be in the form of a housing containing a radiator in one wall, and a bank of fans in an opposite wall to draw a coolant gas through the radiator. The coolant gas contacts the heat sink and a portion of the coolant gas is directed towards the server rack. Cooling liquid is supplied to the radiator by a chiller, which can be adjacent to the heat sink or located remotely from the heat sink.

12 Claims, 4 Drawing Sheets

(56) References Cited

U.S. PATENT DOCUMENTS

| | | |
|---|---|---|
| 2015/0208551 A1 | 7/2015 | Davidson |
| 2016/0113149 A1* | 4/2016 | Krug, Jr. ............ H05K 7/20781 361/679.53 |
| 2018/0046232 A1 | 2/2018 | Wang et al. |

OTHER PUBLICATIONS

Communication Pursuant to Article 94(3) in European Application No. 19153570.7, dated May 12, 2021.

* cited by examiner

LIQUID COOLING WITH OUTDOOR CHILLER RACK SYSTEM

This present application is directed to a system that incorporates both a liquid cooling system and an outdoor chiller unit. Specifically, the liquid cooling system implements a hot swap apparatus to mitigate rising temperatures resulting from heat generated from a server rack system. Simultaneously, the chiller unit maintains the ambient temperature of the server rack system to reduce the total power consumption of the server rack system.

BACKGROUND

Typical server rack systems are configured to house servers and other components. Each of these components generates heat when operational. The combined heat generated by the servers and the other components increases the overall temperature of the components in the server rack, the temperature of the server rack, and the environment surrounding the server rack. This increase in temperature leads to a reduction in the efficiency of the individual servers and the components contained therein.

A conventional approach to reducing the temperature of the server rack system includes implementing a hot swap apparatus. The hot swap apparatus can provide cooling by conduction of the heat, whereby the heat is transferred from the higher temperature heat sink to a lower temperature heat sink. The transfer of heat is achieved by contact with an intermediate thermal contact structure. However, the heat sink may eventually reach an equilibrium temperature with the server rack, such that the transfer of heat by conduction alone is reduced or impaired. Additionally, conduction varies with the temperature of the heat sink. Thus, as the temperature varies, the cooling efficiency of the heat sink varies as well.

Another conventional approach to reducing temperatures of the server rack system includes implementing a convection cooling system. In a convection cooling system a cooling fluid, usually air, traverses a heat source using fans. However, due to the variability of the environment surrounding the server rack, convection cooling may not reliably maintain a desired temperature within the server rack. Further, swirling air currents can re-introduce heated air over the heat source.

Both approaches are generally not reliable means of maintaining a desired temperature for a server rack system or any of the components therein. Thus, there remains a long felt but unsolved problem of maintaining the temperature of a server rack within a specified temperature range to improve the efficiency of operation of the servers and the electronic components contained therein, while reducing the overall server rack system total power consumption.

SUMMARY

It is therefore an object of the present disclosure to provide a hybrid cooling system which combines the functionality of both a hot swap conductive heat transfer between the heat sink and server rack, as well as the use of a chiller unit to cool the server rack and its components by way of convection. The chiller unit can be positioned adjacent to the heat sink, or can be positioned remote therefrom, in the form of an outdoor chiller unit so as to not increase the heat environment near the heat sink. The disclosure is thus directed to a combined hot swap conductive heat transfer between the heat sink and server rack, as well as the use of a chiller unit to remove heat from the server rack and its components by way of convection.

It is a further object of this disclosure to provide a thermal contact structure, or hot swap contact apparatus, to transfer heat from the server rack to a heat sink of the hot swap contact apparatus.

It is a still further object of this disclosure to provide a liquid cooling system comprising a heat transfer device comprising a heat exchanger in the form of a radiator. A cooled liquid, provided by a chiller or chiller unit, flows through the radiator to maintain a constant, specified temperature within the radiator. A series of fans draws a coolant gas through the radiator to effect heat transfer from the liquid coolant in the radiator to the coolant gas. The coolant gas cools the heat sink, with the option of directing a portion of the coolant gas towards the server rack.

It is an additional object of this disclosure to provide an outdoor chiller unit, further comprising a radiator of the chiller unit, to exhaust excess heat from the chiller unit. Positioning of the chiller unit remote from the heat sink, e.g., outside or outdoors of the server rack/heat sink data center does not increase the ambient temperature near the server rack/heat sink system thereby aiding in further removing heat from the server rack.

These and further objects will be described in connection with the appended drawings and the detailed description of the embodiments.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

DETAILED DESCRIPTION

Figure 1:
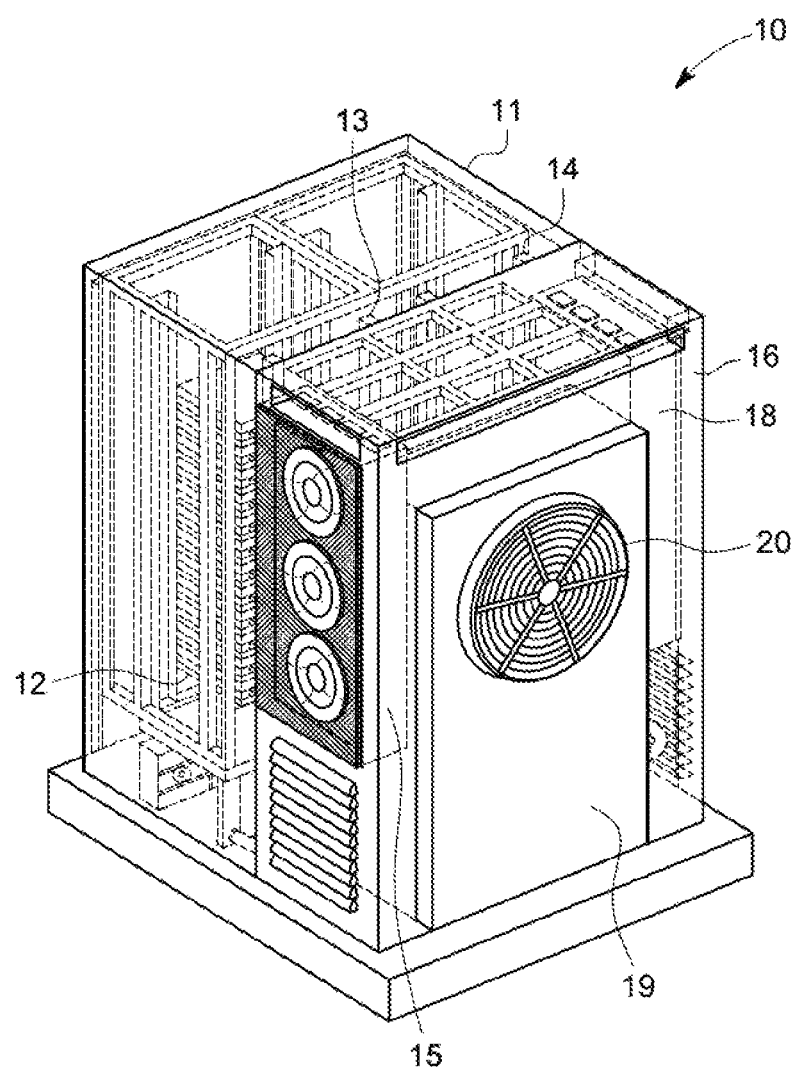
FIG. 1 is an isometric view (partially obscured) of the combination of a liquid cooling system and server rack, with an outside chiller unit.

The present invention is described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. Those skilled in the art will appreciate that not every element is visible in each figure of the drawings. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The present disclosure provides hybrid systems for removing heat from servers in a data center with improved energy efficiency. The hybrid systems include a heat sink in hot swap contact with the server and a cooling system to remove heat from the server and its components by way of convection. The cooling system can provide a liquid coolant that passes through a heat exchanger system including an outdoor chiller system. In this way, the hybrid system embodies both the efficiency of a heat sink and an outdoor chiller unit. Specifically, the disclosed hybrid system is able to efficiently draw heat away from the server and release the heat outside of the data center.

Figure 2:
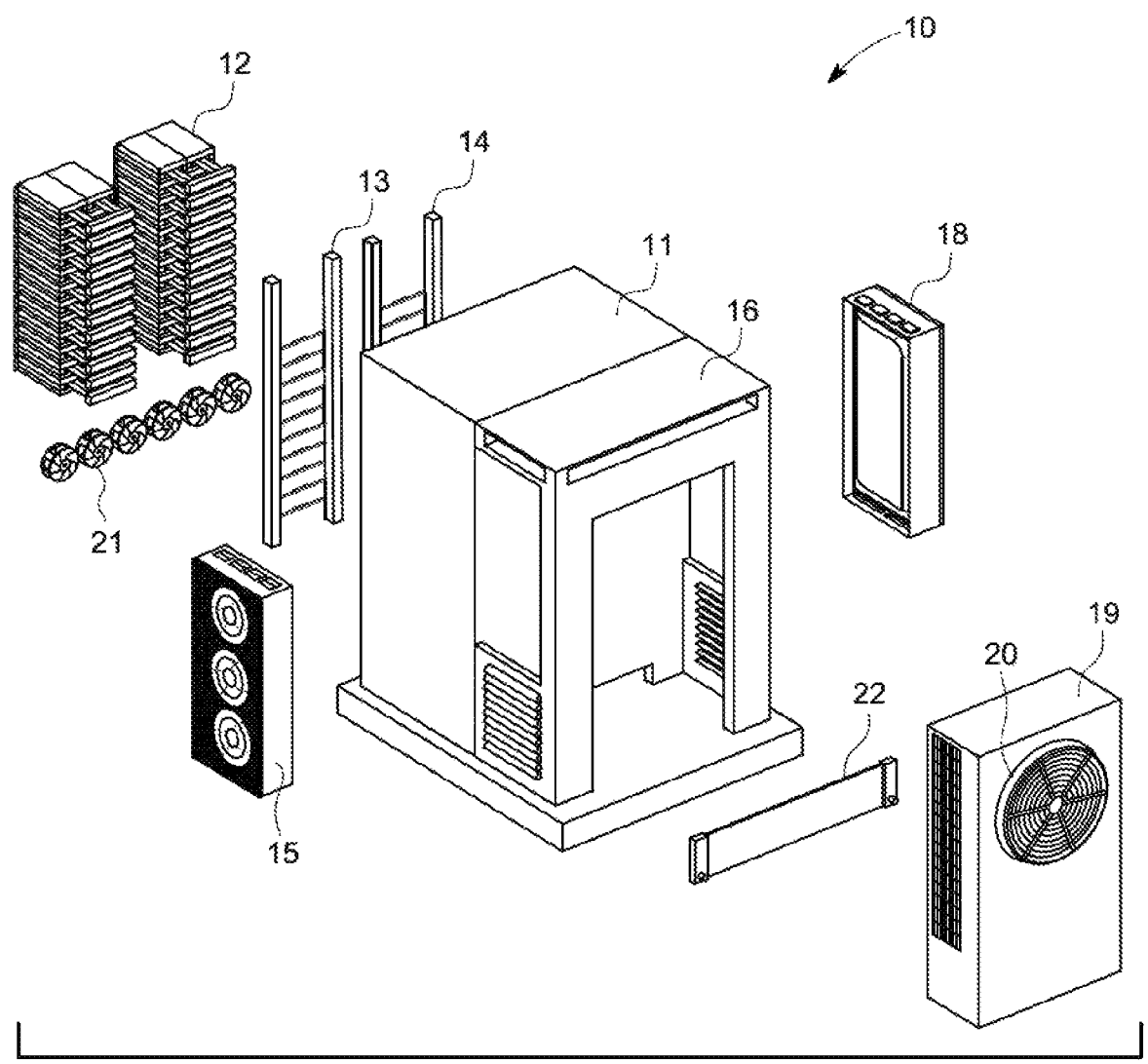
FIG. 2 is an exploded view of FIG. 1 to illustrate the individual components.

FIG. 1 shows a hybrid system 10 that incorporates conduction and convection systems in accordance with an embodiment of the disclosure. FIG. 2 is an exploded view of the hybrid system 10 of FIG. 1 to illustrate portions of the hybrid system 10 that were obscured from view. Like numerals denote like elements in FIGS. 1 and 2. The hybrid system 10 includes a server rack 11. In some embodiments, the server rack 11 can house servers 12 and other heat generating electronic equipment. The number, arrangement and type of servers, and the server rack itself, are for illustrative purposes only, as it is envisioned that the cooling system described here can be used in combination with existing and future server rack devices. In actual use, the server rack 11 is but one of a number of servers contained within a data center. Depending on the number, arrangement, on environment of the servers in the data center, the heat load to be reduced may be variable. Thus, reliance on ambient air to provide the necessary cooling to a plurality of servers cannot be relied upon to maintain the servers within a specified operating temperature range. In view of this, the combination according to the disclosure provides several routes of cooling, which act to maintain the servers within a specified temperature range.

The hybrid system 10 can also include a first thermal contact structure 13, and a second thermal contact structure 14. The first and second thermal contact structures 13 and 14 can be brought into contact with the servers 12. In some embodiments, the first and second thermal contact structures 13 and 14 can be made of metal and brought directly in contact with an electronic component's hot surface. In other embodiments, a thin thermal interface material mediates between the two surfaces.

The servers 12 can include microprocessors and power handling semiconductors as examples of electronics. The hybrid system 10 can also include a heat exchanger 16 that is in thermal contact with the server rack 11. The first and second thermal contact structures 13, 14 can be configured to transfer heat from the servers 12 and server rack 11 to the heat exchanger 16 by conduction (i.e., a hot swap system). As used herein, a "hot swap system" refers to a heat transfer system that does not require or employ any external energy to effect heat transfer between components.

The heat exchanger 16 can include a metal structure with one or more flat surfaces to ensure good thermal contact with the server rack 11 to be cooled. The heat exchanger 16 can also include an array of comb or fin-like protrusions to increase the surface contact with the air, and thus the rate of heat dissipation. The hybrid system 10 can also include a bank of fans 15 configured to draw cooling air through the heat exchanger 16. In this way, the heat exchanger 16 can be used in conjunction with the bank of fans 15 to increase the rate of airflow over the heat exchanger 16. This maintains a larger temperature gradient by replacing warmed air faster than convection would.

Figure 3A:
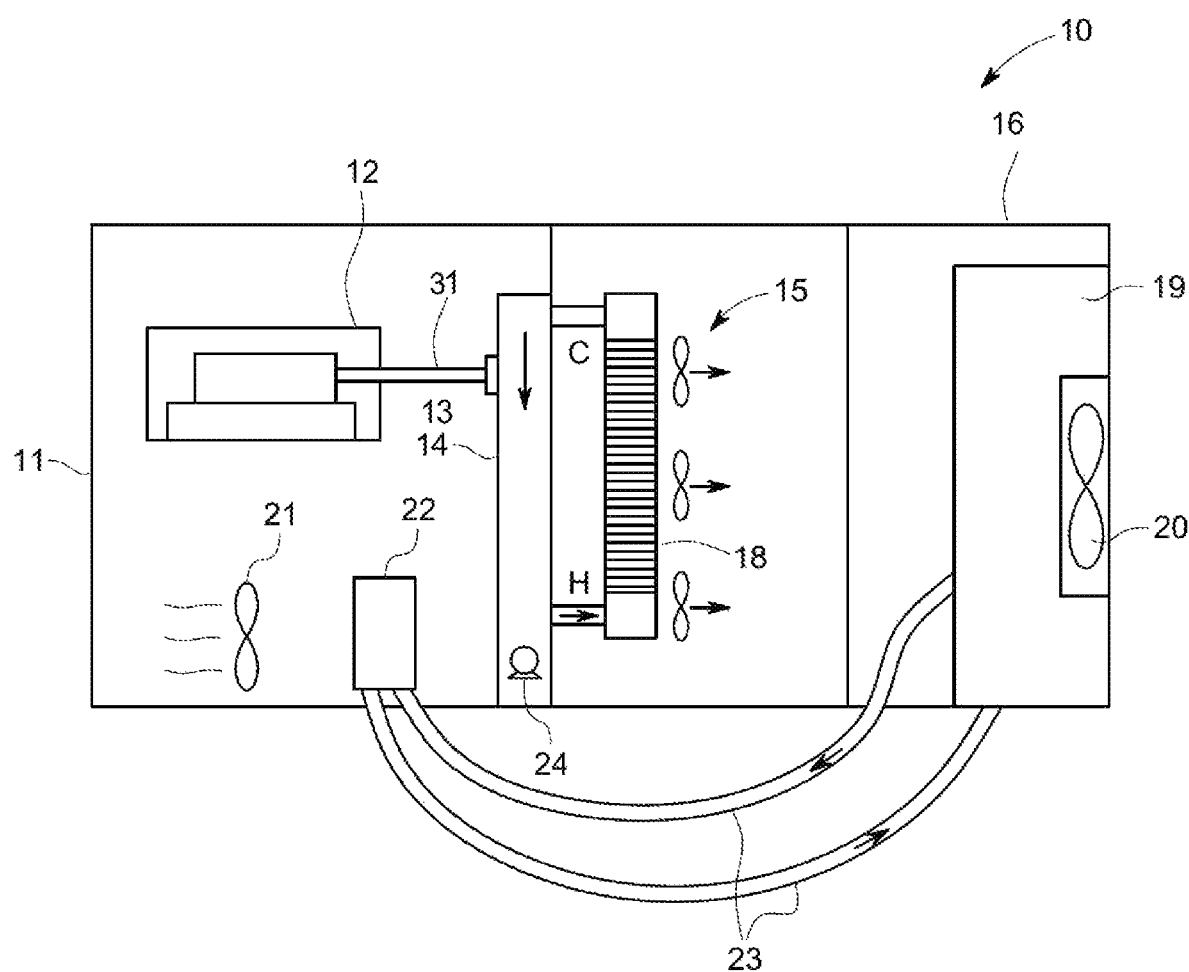
FIG. 3A is side view of FIG. 1 to illustrate the individual components in a first exemplary embodiment.

Referring momentarily to FIG. 3A, the first and second thermal contact structures 13, 14 can be a part of the rack 11. The first and second thermal contact structures 13, 14 can include a pump 24 configured to circulate water to a heat exchanger radiator 18. The heat exchanger radiator 18 can be configured as a heat transfer device to reduce the temperature of the water flowing through the heat exchanger radiator 18. A bank of fans 15 can draw air through the heat exchanger radiator 18 such that the now cooled water is directed towards a cold plate abutting the servers 12.

The heat exchanger radiator 18 can be located within the heat exchanger 16. While FIG. 3A indicates the first and second thermal contact structures 13, 14 include the pump 24, it should be understood that the pump 24 can be located adjacent to the first and second thermal contact structures 13, 14. In alternative embodiments, the first thermal contact structure 13 can have an associated pump and the second thermal contact structure 14 can have a second pump configured to pump water through to the heat exchanger radiator 18. The pump 24 is configured to draw cool water from the heat exchanger radiator 18 to the first and second thermal contact structures 13, 14.

As detailed above in exemplary embodiments, the first and second thermal contact structures 13, 14 can both function as a cold plate. In some alternative embodiments, the first and second thermal contact structures 13, 14 can be in contact with a cold plate 30. This is shown in FIG. 3B.

Figure 3B:
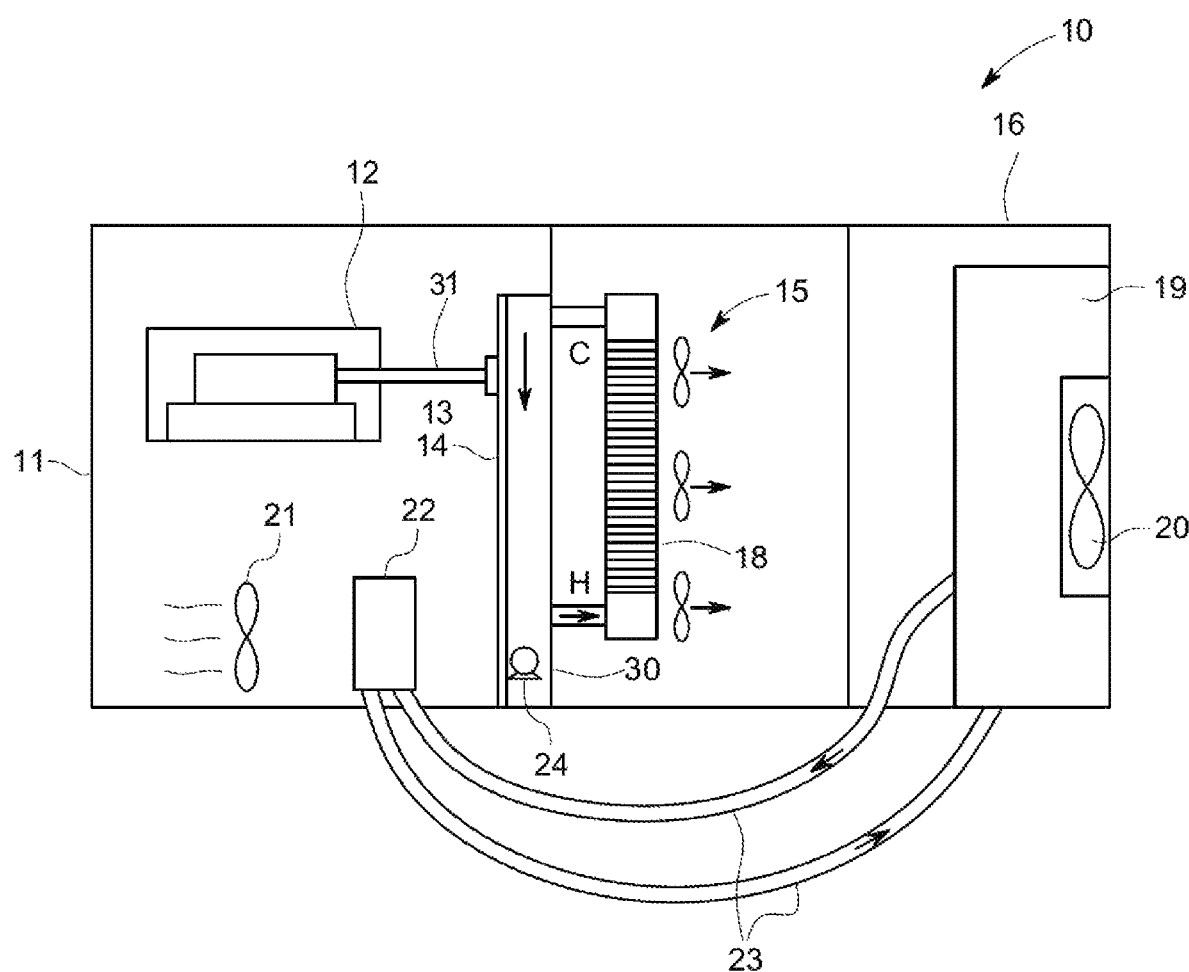
FIG. 3B is side view of FIG. 1 to illustrate the individual components in a second exemplary embodiment.

In FIG. 3B, the pump 24 is configured to draw cool water from the heat exchanger radiator 18 to the cold plate 30, which is in contact with the first and second thermal contact structures 13, 14.

In both embodiments exemplified in FIGS. 3A and 3B, the first and second thermal contact structures 13, 14 are in thermal contact with the servers 12 via a heat pipe 31. The thermal contact between the servers 12 and the first and second thermal contact structures 13, 14 via the heat pipe 31 can cause a heat swap between the servers 12 and the first and second thermal contact structures 13, 14. With respect to FIG. 3A, this heat swap between these components can cause the temperature of the water cycling through the first and second thermal contact structures 13, 14 to increase while the temperature of the surface area of the servers 12 decreases. With respect to FIG. 3B, the heat swap between the servers 12 and the first and second thermal contact structures 13, 14 can cause the temperature of the water cycling through the cold plate 30 to increase while the temperature of the surface area of the servers 12 decreases.

The pump 24 is configured to cycle the water at the increased temperature to the heat exchanger radiator 18 where the bank of fans 15 causes a decrease in temperature of the water via convection. In FIG. 3A, the water is cooled by the convection of the fans and cycled back into the first and second thermal contact structures 13, 14, where the cycle repeats. Alternatively, in FIG. 3B, the water is cooled by the convection of the fans and cycled back into the cold plate 30, where the cycle repeats.

The bank of fans 15 can be located within the heat exchanger 16. In some embodiments, the heat exchanger 16 can be a housing for the bank of fans 15, the heat exchange radiator 18, and a chiller unit 19. The chiller unit 19 is discussed below in greater detail.

The hybrid system 10 can also include a chiller unit 19. The chiller unit 19 can perform functions similar to a refrigeration unit. In the chiller unit 19, a refrigerant gas is compressed, and subsequently expands, thereby reducing its temperature. The chiller unit 19 can be connected to a chiller unit radiator 22 located within the rack 11. As the coolant expands, the coolant is sent from the chiller unit 19 to flow through the chiller unit radiator 22 where a second bank of fans 21 can push the cool air from the radiator into the rack 11. The second bank of fans 21 can be configured to work in combination with the chiller unit 19 to remove heat from the server rack 11 and its components, by way of convection. In this way, the chiller unit 19 is configured to maintain a uniform, specified temperature range for the rack 11 and servers 12 contained therein, in order to maintain the efficiency of the servers. The chiller unit 19 can also incorporate a fan 20. The fan 20 is incorporated to exhaust the heat generated within the chiller unit 19 resulting from the compression of the coolant.

In some embodiments, the chiller unit 19 provides a constant flow of chilled liquid (not shown) to the chiller unit radiator 22. The constant flow of chilled liquid provided to the chiller unit radiator 22 can be easily regulated by thermostatic controls (not shown) depending on the cooling requirements imposed by the servers 12 in the rack 11. The thermostatic controls can be within the chiller unit radiator 22 to sense the temperature of the coolant liquid therein. In some embodiments, the thermostatic controls could also be within the heat exchanger radiator 18.

Furthermore, because the chiller 19 can provide a constant supply of chilled liquid to the chiller unit radiator 22, it is a much more reliable source of cooled air to the servers 12 from the second bank of fans 21. Additionally, the heat transfer coefficient of the chilled liquid coolant provided to chiller unit radiator 22 can be selected so that the chilled liquid coolant transfers heat more efficiently than ambient air. In some implementations, the chiller unit 19 can utilize a refrigerant gas system to reduce the temperature of the fluid supplied to chiller unit radiator 22.

FIGS. 3A and 3B are provided herein to illustrate a side view of FIG. 1 and portions of the hybrid system 10 that were obscured from view. FIGS. 3A and 3B also exemplify a detailed view of all that is contained within the rack 11 and the heat exchanger 16. Although the chiller unit 19 is illustrated as being within the heat exchanger 16, it is to be expressly understood that such illustration is exemplary only of one embodiment. The chiller unit 19 can be located adjacent or remote from the heat exchanger 16, such as with an exterior wall of a data center separating the heat exchanger 16 from chiller unit 19. In such an embodiment, conduits can carry the source of cooled fluid from the chiller unit 19 to the chiller unit radiator 22. Conduits 23 connecting the chiller unit 19 and the chiller unit radiator 22 can convey the coolant fluid from the chiller unit 19 to the chiller unit radiator 22, with the cycle repeating. In some implementations, these conduits 23 can be insulated to avoid heating of the cooled fluid by the ambient air of the data center or to avoid release of heat into the ambient air of the data center.

Servers 12 can house any number and type of electronic devices that produce heat. Examples of these electronic devices include central processing units ("CPU"), graphics processing units ("GPU"), and peripheral component interconnect express ("PCIe" or "PCI-E") cards, among other electronic components. All of these components have temperature range specifications for efficiency in use. Once the temperature range is exceeded, efficiency of the components is reduced. Thus, the need to maintain a specified temperature range is a requirement for efficient use of servers 12.

The terminology used herein is for the purpose of describing particular embodiments only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

We claim:

1. A combination of a server rack containing servers therein and a heat transfer apparatus, the combination comprising:
    a server rack housing servers;
    a heat exchanger defining a housing;
    a thermal contact structure disposed between the server rack and the heat exchanger to place the server rack and heat exchanger in thermal contact; and
    a chiller disposed directly adjacent to the heat exchanger, the chiller providing a source of cooling liquid to the heat exchanger to cool the server rack,
    wherein the heat exchanger includes a radiator operatively connected to the cooling liquid from the chiller, and wherein the housing includes a set of cooling fans positioned to draw air through the radiator to cool the servers and the server rack.

2. A cooling system for servers in a server rack comprising:
    a thermal contact structure to place the server rack into thermal contact with a heat exchanger including a radiator;
    a chiller configured to be encased by a housing of the heat exchanger and to provide a source of cooling liquid to the radiator, the radiator operatively connected to the cooling fluid provided by said chiller; and
    at least one bank of fans to draw air through said heat exchanger to cool the air,
    wherein the cooled air cools the servers in the server rack.

3. The cooling system of claim 2, further comprising a second bank of fans, wherein said second bank of fans directs a portion of the air drawn through said heat exchanger towards the server rack.

4. The cooling system of claim 2, wherein said chiller comprises a refrigerant gas.

5. The cooling system of claim 2, wherein the chiller further comprises a radiator to disperse waste heat from the chiller.

6. A method of maintaining an operating temperature of a series of servers in a server rack within a predetermined range of temperatures, the method comprising:
    removing heat from the server rack through conductive thermal contact with a heat exchanger;
    removing heat from the server rack by contacting a coolant gas with a radiator containing a cooling liquid, wherein the radiator is supplied with the cooling liquid from a chiller; and placing the chiller directly adjacent to the heat exchanger, wherein the heat exchanger is in the form of a housing containing both the radiator and a bank of fans to draw the coolant gas through the radiator.

7. The method of claim 6, further comprising directing at least a portion of the coolant gas towards the servers in the server rack.

8. The method of claim 6, further comprising providing the cooling liquid by compressing a refrigerant gas in the chiller, and transferring heat from the cooling liquid by indirectly contacting the cooling liquid with the refrigerant gas.

9. The method of claim 8, wherein the step of indirectly contacting is performed in the heat exchanger.

10. The method of claim 6, further comprising the step of removing heat from the server rack by the process of convection.

11. The method of claim 10, further comprising monitoring the temperature of the server rack, and controlling the steps of removing heat from the server rack so as to maintain the server rack within a predetermined temperature range.

12. The method of claim 6, wherein contacting the coolant gas with the heat exchanger comprises mounting the radiator on the heat exchanger, and drawing the coolant gas through the radiator with the bank of fans.

\* \* \* \* \*